United States Patent [19]

Vogelzang

[11] 4,404,048

[45] Sep. 13, 1983

[54] SEMICONDUCTOR DEVICE MANUFACTURE

[75] Inventor: Dirk A. Vogelzang, Nijmegen, Netherlands

[73] Assignee: U.S. Philips Corporation, New York, N.Y.

[21] Appl. No.: 321,500

[22] Filed: Nov. 16, 1981

[30] Foreign Application Priority Data

Dec. 17, 1980 [NL] Netherlands .................... 8006827

[51] Int. Cl.³ .................... H01L 21/20; H01L 21/223
[52] U.S. Cl. ............................... 148/175; 29/576 W; 148/187; 148/190; 148/191
[58] Field of Search ............... 148/187, 188, 175, 190, 148/191; 29/576 W

[56] References Cited

U.S. PATENT DOCUMENTS

| | | | |
|---|---|---|---|
| 3,663,872 | 5/1972 | Yanagawa | 148/175 X |
| 3,667,006 | 5/1972 | Ruegg | 148/175 X |
| 3,930,909 | 1/1976 | Schmitz et al. | 148/175 |
| 4,087,900 | 5/1978 | Yiannoulos | 148/175 X |
| 4,132,573 | 1/1979 | Kraft | 148/175 |

Primary Examiner—G. Ozaki
Attorney, Agent, or Firm—Thomas A. Briody; Robert T. Mayer; Steven R. Biren

[57] ABSTRACT

P-type isolation regions, which surround an island of an n-type epitaxial layer, are formed by providing a p-type dopant at a part of the surface of a p-type silicon substrate. After growing the layer a p-type dopant is also provided at the surface of the layer opposite the part of the substrate surface where the dopant is provided. The dopants are diffused into the layer until the p-type regions meet. To inhibit diffusion of the p-type dopant during epitaxial growth, an n-type dopant having a lower diffusion coefficient than that of the p-type dopant is provided at the part of the substrate surface before providing the epitaxial layer. Formation of the isolation regions can be carried out simultaneously with the formation of p-type regions of a circuit element, for example a transistor, in the islands.

4 Claims, 1 Drawing Figure

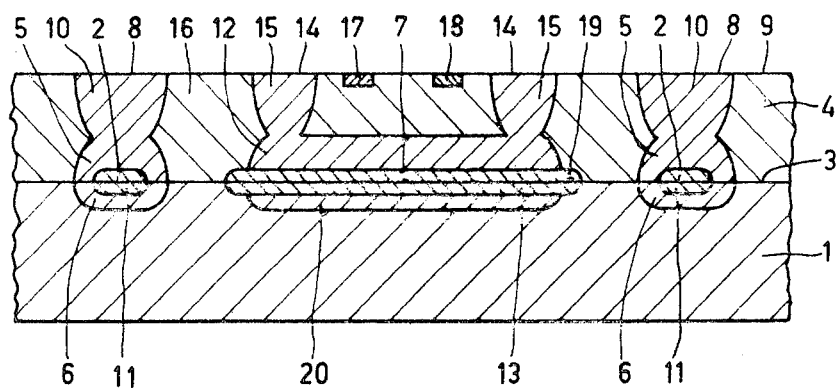

SEMICONDUCTOR DEVICE MANUFACTURE

BACKGROUND OF THE INVENTION

The invention relates to a method of manufacuturing a semiconductor device, in which a p-type dopant is provided at a part of a surface of a p-type monocrystalline silicon substrate and is diffused into the substrate, an n-type epitaxial silicon layer is then provided on the surface, after which a p-type dopant is provided at a part of the surface of the epitaxial layer opposite said part of the substrate surface, wherein the p-dopants are diffused into the epitaxial layer from two sides by a thermal treatment to form diffused p-type regions which meet each other in said layer.

A method having these features is disclosed in Netherlands Patent Application No. 6700755, in which the formation of island-insulation regions is described. As a p-type dopant, boron is locally introduced into a silicon substrate so as to obtain a highly boron-dopant region.

Such a highly doped region in the substrate creates a problem in that epitaxial silicon layers which are deposited thereon may not have the desired composition due to autodoping with the boron of the doped region.

SUMMARY OF THE INVENTION

According to the invention, a method having the features mentioned in the opening paragraph is characterized in that in order to inhibit diffusion of the p-type dopant, an n-type dopant having a smaller diffusion coefficient than that of the p-type dopant is provided at the part of the substrate surface where the p-type dopant is provided and the n-type dopant is then diffused into the substrate before the epitaxial layer is provided.

By using a method in accordance with the invention, autodoping by the p-type dopant can be prevented or at least reduced to acceptable proportions.

Boron is preferably provided at the substrate surface as a p-type dopant, and, since the diffusion coefficient of antimony is much smaller than that of boron and since antimony provides only negligible autodoping in epitaxy, antimony is preferably used as an n-type dopant.

By using a method in accordance with the invention, island insulation in various types of semiconductor device can be obtained.

When the p-type dopant is provided at one part of the substrate surface the p-type dopant may also be provided at another part of the substrate surface, and when the n-type dopant is provided at said one part of the substrate surface the n-type dopant may also be provided at a part of the substrate surface which is larger than and overlaps said other part, and after providing the epitaxial layer the p- and the n-type dopants can be diffused into the epitaxial layer by the thermal treatment so as to obtain in the epitaxial layer a p-type region which is separated from the substrate by an n-type region. In this manner a double buried layer is obtained which can be used in many types of semiconductor device.

BRIEF DESCRIPTION OF THE DRAWING

An illustrative embodiment of the invention will now be described with reference to the accompanying drawing. The drawing is a diagrammatic sectional view of a part of a semiconductor device at a stage during its manufacture using a method in accordance with the invention. The manufacture of a circuit element forming part of an integrated circuit will be described hereinafter by way of example.

DESCRIPTION OF THE PREFERRED EMBODIMENTS

A p-type dopant is provided at a part 2 (see the FIGURE) of a surface 3 of a p-type monocrystalline silicon substrate 1, and is diffused into the substrate 1.

An n-type epitaxial silicon layer 4 is then provided on the surface 3 and a p-type dopant is provided at a part 8 of the surface 9 of this layer opposite the part 2 of the substrate surface 3. By a thermal treatment the p-type dopant is diffused into the layer 4 from two sides to form diffused p-type regions 5 and 10 which meet each other in the epitaxial layer 4.

In order to avoid autodoping of the epitaxial layer 4 by diffusion of the p-type dopant over the whole epitaxial layer 4, an n-type dopant, which has a smaller diffusion coefficient than the p-type dopant, is provided at the same part 2 of the substrate surface 3 where the p-type dopant is provided. The n-type dopant is diffused before the epitaxial layer 4 is provided.

The more slowly-diffusing n-type dopant exerts an inhibiting effect on the diffusion of the p-type dopant so that the latter, during the deposition of the epitaxial layer, does not spread throughout the layer. As a result of the difference in diffusion rates between the dopants, the n-type doped region 11 is embedded in the doped regions 5 and 6 at the boundary between the substrate 1 and the epitaxial layer 4.

In a preferred embodiment of the invention, the p-type dopant is also provided at another part 7 of the substrate surface 3 simultaneously with the provision of the p-type dopant to the part 2 of the substrate surface 3.

Also, simultaneously with the provision of the n-type dopant at the part 2 of the substrate surface 3, the n-type dopant is provided at a part 19 of the substrate surface 3. The part 19 is larger than and overlaps the other part 7.

After providing the epitaxial layer 4 the p-type dopant and the n-type dopant are diffused from the substrate into the epitaxial layer 4 by a thermal treatment so as to obtain in the epitaxial layer 4 a p-type region 12 which is separated from the substrate 1 by an n-type region 13. The regions 12 and 13 form a double buried layer. The starting material in the manufacture of a typical semiconductor device may be, for example, a disc-shaped 600 $\mu$m thick p-type silicon substrate having a resistivity of 25 $\Omega$cm.

In a conventional manner, after masking by means of an oxide provided by vapor deposition, a dose of $10^{19}$ boron atoms/cm$^2$ is provided at parts 2 and 7 of the surface 3 as a p-type dopant. Diffusion at 1160° C. is then carried out for 30 minutes.

The part 7 of the surface 3 is then made bigger to form part 19 and a dose of $2 \times 10^{15}$ antimony atoms/cm$^2$ as an n-type dopant is then introduced into the substrate by ion implantation via the parts 2 and 19. P-type regions 6,20 and n-type regions 11,13 are formed by diffusion for 5 hours at 1250° C.

A 40 $\mu$m thick n-type epitaxial silicon layer 4 having a resistivity of 35 $\Omega$cm is then provided on the surface 3 of substrate 1. After masking, a dose of $2 \times 10^{18}$ aluminum atoms/cm$^2$ as a p-type dopant is provided in the usual manner at parts 8 and 14 of the surface 9 of the epitaxial layer 4.

In a subsequent thermal treatment at 1200° C. for 10 hours, the p-type dopant diffuses to form p-type regions 5, 10 and 12, 15 respectively, which meet each other in the epitaxial layer 4.

The adjoining p-type regions 5 and 10 may be used for the isolation of islands 16 in the epitaxial layer 4 so that circuit elements of an integrated circuit present in islands not shown can be electrically isolated from each other.

The regions 15 may serve for contacting the collector 12 of a vertical p-n-p transistor having an emitter regions 17 and a base contact region 18. The p-type collector 12 is separated from the p-type substrate 1 by the n-type buried layer 13.

The invention is not restricted to the embodiment described. For example, in addition to boron, aluminum or gallium may be used as a p-type dopant in the substrate and aluminum, boron or gallium may be provided at the surface of the epitaxial layer as a p-type dopant. In addition to antimony, arsenic may also be used as an n-type dopant.

What is claimed is:

1. A method of manufacturing a semiconductor device, which comprises:
    providing a p-type monocrystalline silicon substrate having a major surface;
    providing a p-type dopant at a part of said major substrate surface and diffusing said dopant into the substrate;
    providing an n-type dopant having a smaller diffusion coefficient than that of said p-type dopant at said part of the major substrate surface where the p-type dopant is provided in order to inhibit diffusion of said p-type dopant;
    diffusing said n-type dopant into the substrate;
    then forming an n-type epitaxial silicon layer having an upper surface on said major surface of the substrate;
    providing a further p-type dopant at a part of said upper surface of the epitaxial layer opposite said part of the major surface of the substrate; and
    then diffusing said p-type dopants into the epitaxial layer from both sides by a thermal treatment to form diffused p-type regions which meet in said epitaxial layer.

2. A method as claimed in claim 1, wherein boron is provided at the substrate surface as said p-type dopant.

3. A method as claimed in claim 2, wherein antimony is used as said n-type dopant.

4. A method as claimed in claim 1, 2 or 3, wherein when the p-type dopant is provided at one part of the substrate surface the p-type dopant is also provided at another part of the substrate surface, and when the n-type dopant is provided at said one part of the substrate surface the n-type dopant is also provided at a part of the substrate surface which is larger than and overlaps said other part, and after providing the epitaxial layer the p- and the n-type dopants are diffused from the substrate into the epitaxial layer by the thermal treatment so as to obtain a p-type region in the epitaxial layer which is separated from the substrate by an n-type region.

* * * * *